United States Patent [19]
Jeon

[11] Patent Number: 5,341,331
[45] Date of Patent: Aug. 23, 1994

[54] DATA TRANSMISSION CIRCUIT HAVING COMMON INPUT/OUTPUT LINES

[75] Inventor: Jun-Young Jeon, Seoul, Rep. of Korea

[73] Assignee: SamSung Electronics, Co., Ltd., Suwon, Rep. of Korea

[21] Appl. No.: 785,098

[22] Filed: Oct. 30, 1991

[30] Foreign Application Priority Data

Jul. 31, 1991 [KR] Rep. of Korea ............... 13283

[51] Int. Cl.⁵ .................................... G11C 7/00
[52] U.S. Cl. ..................... 365/189.01; 365/230.03; 365/154
[58] Field of Search ............ 365/189.01, 230.03, 365/154, 189.05, 194, 203

[56] References Cited

U.S. PATENT DOCUMENTS

| | | | |
|---|---|---|---|
| 4,984,202 | 1/1991 | Kawahara et al. | 365/203 |
| 5,051,954 | 9/1991 | Toda et al. | 365/230.03 |
| 5,274,595 | 12/1993 | Seok et al. | 365/203 |
| 5,283,760 | 2/1994 | Chin et al. | 365/189.01 |

OTHER PUBLICATIONS

Nakagome et al., "A 1.5V Circuit Technology for 64Mb DRAMs", 1990 Symposium on VLSI Circuits, pp. 17–18.

*Primary Examiner*—Eugene R. LaRoche
*Assistant Examiner*—Andrew Q. Tran
*Attorney, Agent, or Firm*—Robert E. Bushnell

[57] ABSTRACT

A data transmission circuit of a semiconductor integrated circuit capable of achieving high integration and high-speed operation is disclosed. A data input/output line is constructed as a pair of common input/output lines 71 and 72, and input transistors 77 and 78 are constructed as a pair. The potential of the bit lines are not transferred to the input/output lines 71 and 72 through the channels of output transistors 75 and 76, but transferred to control terminals of the output transistors 75 and 76 coupled to the input/output lines 71 and 72, to thus access predetermined data through the sensing operation of the output transistors 75 and 76. Therefore, the data input/output can be performed at high speed, and its construction is compact, thereby improving the degree of integration of a semiconductor integrated circuit.

18 Claims, 4 Drawing Sheets

DATA TRANSMISSION CIRCUIT HAVING COMMON INPUT/OUTPUT LINES

BACKGROUND OF THE INVENTION

The present invention relates to a data transmission circuit of a dynamic random access memory (DRAM) in a semiconductor integrated circuit, and more particularly to the data transmission circuit capable of performing high-speed operation with a high degree of integration.

Recently, a need for both the large-scale integration of a semiconductor integrated circuit and the high-speed operation of a chip thereof has been developed. However, if the large-scale integration of the semiconductor integrated circuit is achieved, it is difficult for the chip to operate at high speed, and if the high-speed operation of the chip is achieved, it is difficult to realize the semiconductor circuit having a high degree of integration. Therefore the simultaneous achievement of the high-speed operation and high integrated degree is one of the problems to be solved in the field of the semiconductor integrated circuit. In particular, it is a well known fact that, in a data transmission circuit directly related to the high-speed operation and the high integration, the improved construction method of the data transmission circuit and the enhanced device of each element therein should be contrived, in order to provide a semiconductor integrated circuit with a higher integrated degree and a higher operating speed than present.

FIG. 1 shows a schematic diagram of a conventional data transmission circuit, and FIG. 2 shows a timing chart during the read operation of FIG. 1. The circuit of FIG. 1 is comprised of memory cells 9 and 10, word lines 11 and 12, bit lines 15 and 16, a sense amplifier 7 for sensing the bit lines 15 and 16, isolation transistors 1, 2, 3 and 4 for isolating the memory cells 9 and 10, respectively, input/output transistors 5 and 6, each having a channel, one terminal of each channel being connected to the bit lines 15 and 16, respectively, common input/output lines 13 and 14 connected to the other terminal of the channel of the input/output transistors 5 and 6, respectively, and an input/output line sense amplifier 8 for sensing the common input/output lines 13 and 14.

The operation of FIG. 1 is described in conjunction with FIG. 2. When reading out the data stored in the memory cell 9, the isolation transistors 1 and 2 connected to the memory cell 9 are turned on, and the isolation transistors 3 and 4 are turned off. Moreover, the word line 11 of the memory cell 9 is selected so that the data of the memory cell 9 is transferred to the bit line 15. Thus, the potential of the bit lines 15 and 16 is different, and the potential difference between the bit lines 15 and 16 is amplified through the sense amplifier 7. Thereafter, data of the bit lines 15 and 16 is transferred to the input/output lines 13 and 14 through the input/output transistors 5 and 6 if a column selection line CSL signal of logic "high" is applied to the gates of the input/output transistors 5 and 6. The potential difference of data in the input/output lines 13 and 14, which is pulled down by the parasitic capacitance of the input/output lines 13 and 14, is amplified through the input/output sense amplifier 8. The main feature of this data transmission circuit lies in that the bit lines 15 and 16 and the input/output lines 13 and 14 are connected to the source and drain of the input/output transistors 5 and 6. Accordingly, since the column selection line CSL signal must be selected after the potential difference of the bit lines 15 and 16 is sufficiently amplified, there occurs the decrease of the output speed caused by the delay time of the column select line CSL line. Namely, as shown in FIG. 2, when the potential difference $\Delta V_{BL}$ of the bit lines BL and $\overline{BL}$ is approximately 1V, the column selection line CSL signal is enabled as a logic "high" level. Furthermore, since the data transferred to the input/output lines 13 and 14 pass through the input/output transistors 5 and 6, a voltage drop as much as the threshold voltage of the input/output transistors 5 and 6, is generated. In addition, when the input/output transistors 5 and 6 are turned on, since the input/output lines 13 and 14 and the bit lines 15 and 16 are connected to the input/output transistors 5 and 6, the parasitic capacitance is amplified, and the potential difference of the data transferred to the input/output lines 13 and 14 is further decreased. As a result, the sensing capability of the input/output line sense amplifier 8 is deteriorated.

FIG. 3 shows a schematic diagram of another conventional data transmission circuit. The circuit is disclosed in "1991 Symposium on VLSI (very large scale integration) Circuit", Texas Instruments, Inc., a paper on 64 mega DRAM. The feature of the circuit in FIG. 3 lies in the fact that the data of a memory cell 20 is not directly transferred to data input/output lines 37 and 38, but transferred to the gates of output transistors 27 and 28. As a result, the transfer speed of the data becomes faster, and the decrease of a potential caused by the loading of bit lines 21 and 22 is not generated.

The data transmission circuit of FIG. 3 includes the memory cell 20, first isolation transistors 23 and 24, bit lines 21 and 22, a bit line sense amplifier 25, sub input/output lines 33 and 34, second isolation transistors 31 and. 32 for isolating or connecting the bit lines 21 and 22 and sub input/output lines 33 and 34, a ground transistor 26, output transistors 27 and 28, input transistors 29 and 30, transfer transistors 35 and 36, data input/output lines 37 and 38, and an input/output line sense amplifier 39 for sensing the potential difference between data input/output lines 37 and 38.

A memory array element 40 shown in dotted line is a part of a given memory array block, which is shown in detail in FIG. 4. Referring to FIG. 4, it will be appreciated why the second isolation transistors 31 and 32 of FIG. 3 are constituted in such a manner. Namely, in the memory array block in FIG. 4, a plurality of memory cells exist and each bit line is connected to each memory cell. Therefore, only control of the second isolation transistors is needed in order to select a given bit line among these bit lines.

With reference to FIG. 5, illustrating a timing chart of FIG. 3 during the read operation, the operating characteristic of FIG. 3 will be described in detail. In this case, it should be noted that since the output transistors 27 and 28 for reading and input transistors 29 and 30 for writing, are separately constructed, a read column selection line RCSL signal and a write column selection line WCSL signal, for respectively controlling the above transistors, are separately applied. The reading operation of the data of the memory cell 20 is as follows. The first isolation transistors 23 and 24 are turned on, and the data of the memory cell 20 is transferred to the bit line 21. Thus the potential difference between the bit lines 21 and 22 is amplified by the sense amplifier 25. If the second isolation transistors 31 and 32 are turned on, the data is transferred to the sub input/output lines 33 and 34, and further is transferred to the gates of the output transistors 27 and 28. At this time, if the read column selection line RCSL signal is selected, the ground transistor 26 is turned on and the output transistors 27 and 28 come to serve as a sense amplifier. In other words, for example, if the data of the memory cell 20 is logic "1", the output transistor 27 is turned on and the output transistor 28 is turned off. In this case, if the transfer transistors 35 and 36 are turned on, the potential of the data input/output line 37 becomes a ground voltage level. Similarly, it will be readily appreciated that if the data of the memory cell 20 is logic "0", the potential of the data input/output line 38 becomes the ground voltage level. Accordingly the data of the input/output lines 37 and 38 are transferred to the exterior of a chip through the input/output sense amplifier 39. That is, the data of the memory cell 20 is read out.

Meanwhile, so as to write the data into the memory cell 20 after the given data is transferred up to the data input/output lines 37 and 38, firstly the transfer transistors 35 and 36 should be turned on. If the write column selection line WCSL signal is selected and the input transistors 29 and 30 are turned on, the data of the input/output lines 37 and 38 are transferred to the sub input/output lines 33 and 34. If the second isolation transistors 31 and 32 are turned on, the data is transferred to the bit lines 21 and 22, and the potential difference of the data is amplified at the bit line sense amplifier 25. Thereafter, the data is stored into the memory cell 20 through the first isolation transistors 23 and 24.

In the data transmission circuit shown in FIG. 3, since the sub input/output lines 33 and 34, transferring the potential of the bit lines 21 and 22 to the data input/output lines 37 and 38, are connected directly to the gates of the output transistors 27 and 28, the output speed of the data is improved in comparison with the circuit of FIG. 1. However, during the read and write operation, a voltage drop is generated. In more detail, during the read operation, since, in order to transfer data to the data input/output lines 37 and 38, the data of the bit lines 21 and 22 must pass through two NMOS transistors 31 and 35, and 32 and 36, respectively, and a voltage drop as much as $2V_{TH}$ (wherein $V_{TH}$ is the threshold voltage of an NMOS transistor) is generated. This leads to a delay of the switching time point during the complementary switching operation of the output transistors 27 and 28. That is, as shown in FIG. 5, even if a signal ΘSAE is enabled as a power voltage $V_{CC}$ level, thereby turning on the second isolation transistors 31 and 32, since the potential difference between the sub input/output lines 33 and 34 is increased after the potential of the bit lines 21 and 22 is sufficiently amplified at the bit line sense amplifier 25, the enable time point of the read column selection line RCSL signal is delayed. Consequently, the speed of the data access time becomes slower. Furthermore, during the write operation, since, in order to transfer the given data of the data input/output lines 37 and 38 to the bit lines 21 and 22, the data must pass through three NMOS transistors 35, 29 and 31, and 36, 30 and 32, respectively, and a voltage drop as much as $3V_{TH}$ is generated.

To prevent the above problems, in the circuit shown in FIG. 3, the voltage applied to the gates of the first isolation transistors 23 and 24, the second isolation transistors 31 and 32 and the transfer transistors 35 and 36, should be higher than the power voltage $V_{CC}$, and a predetermined bootstrap circuit (not shown) is necessitated. However, since this leads to the deterioration of the high integration, the application of a future VLSI semiconductor memory device, is difficult.

SUMMARY OF THE INVENTION

It is therefore an object of the invention to provide a data transmission circuit capable of realizing the high integration of a chip and performing high-speed operation of data input/output.

In accordance with the present invention, a data transmission circuit of a semiconductor memory device has first and second memory array blocks, bit lines BL and $\overline{BL}$, isolation transistors, a bit line sense amplifier, common input/output lines, input means and output means. The first and second memory array blocks are comprised of a plurality of memory cells storing given data. The bit lines BL and $\overline{BL}$ are commonly connected to the first and second memory array blocks. The isolation transistors are connected to the bit lines BL and $\overline{BL}$, and are for selecting the first or second memory array block. The bit line sense amplifier is for amplifying the potential difference of the bit lines BL and $\overline{BL}$. Further, the common input/output lines commonly transfer the data of the first and second memory array blocks. The input means, for transferring the data of the common input/output lines to the bit lines BL and $\overline{BL}$, has a pair of channels connected between the common input/output lines and the bit lines BL and $\overline{BL}$, and is operated by a given control signal. And the output means has a control terminal connected to the bit lines BL and $\overline{BL}$, and a pair of channels, one terminal of each channel being connected to one of each common input/output line. The output means transfers the state of the potential difference of the bit lines BL and $\overline{BL}$ sensed by a given operating signal, to the common input/output lines. In the above, the control signal is a write column selection line WCSL signal and the operating signal is a read column selection line RCSL signal.

BRIEF DESCRIPTION OF THE DRAWINGS

The above objects and other advantages of the present invention will become more apparent by describing in detail the preferred embodiment of the present invention with reference to the attached drawings, in which.

DETAILED DESCRIPTION OF THE PREFERRED EMBODIMENT

Figure 6:
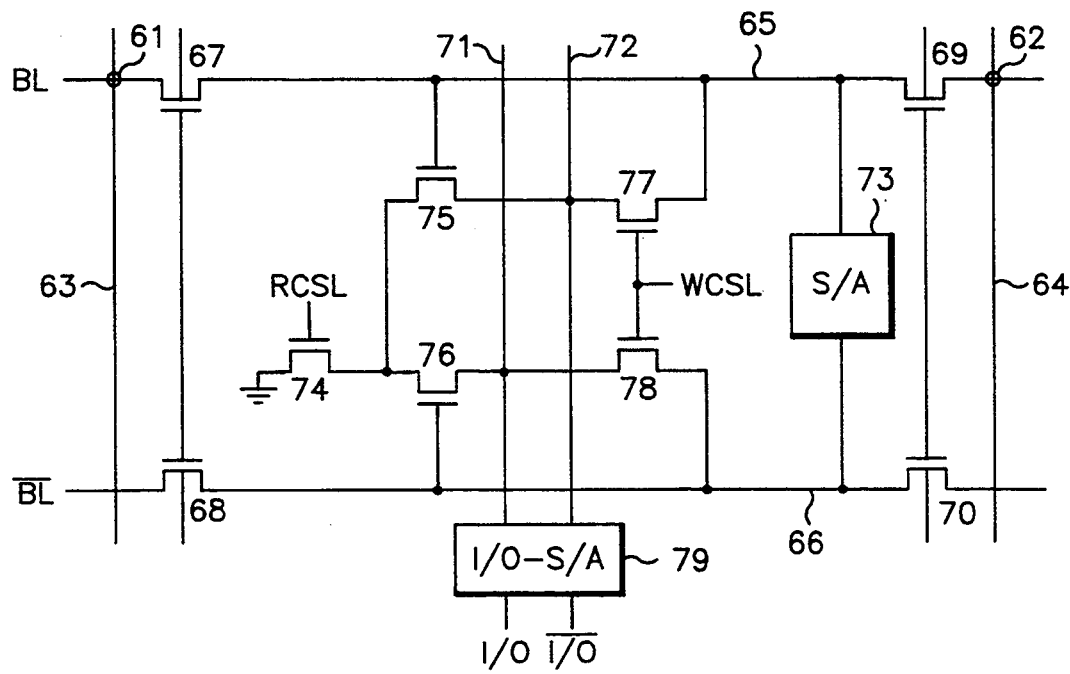
FIG. 6 shows a schematic diagram of a data transmission circuit according to the present invention.

In FIG. 6, a data input/output circuit performing the data transfer is constructed with a pair of common input/output lines. Input and output means are separately provided and are operated by different control signals, respectively. Namely, in order to operate the data input/output at high-speed, the gate of an output transistor of the output means is connected directly to a bit line, and the channel of an input transistor of the input means is connected between the common input/output line and the bit line. Moreover, in order to achieve the high integration of the circuit, the data input/output circuit is constructed with a pair of common input/output lines, to thus decrease the number of transistors.

As shown, a pair of bit lines 65 and 66 are connected to memory cells 61 and 62 storing the given data, respectively. Isolation transistors 67, 68, 69 and 70 separate the respective memory cells 61 and 62. A sense amplifier 73 amplifies the potential difference of a pair of the bit lines 65 and 66. First and second input/output lines 71 and 72 perform the complementary data transfer. A first input transistor 77 has a channel connected between the second (or first) input/output line 72 (or 71) and the bit line 65, and a control terminal connected to receive a write column selection line WCSL signal, while a second input transistor 78 has a channel connected between the first (or second) input/output line 71 (or 72) and the bit line 66, and a control terminal connected to receive the write column selection line WCSL signal. One terminal of the channel of a discharge transistor 74 is connected to a ground voltage, with a control terminal connected to receive a read column selection line RCSL signal. A first output transistor 75 is comprised of a channel connected between the other terminal of the channel of the discharge transistor 74 and the second (or first) input/output line 72 (or 71), and a control terminal connected to the bit line 65. The channel of a second output transistor 76 is connected between the other terminal of the channel of the discharge transistor 74 and the first (or second) input/output line 71 (or 72), with a control terminal connected to the bit line 66. Though not shown in the Figure, the memory cells 61 and 62 exist in different memory blocks, respectively, and one data transmission circuit is in charge of two memory array blocks.

Figure 1:
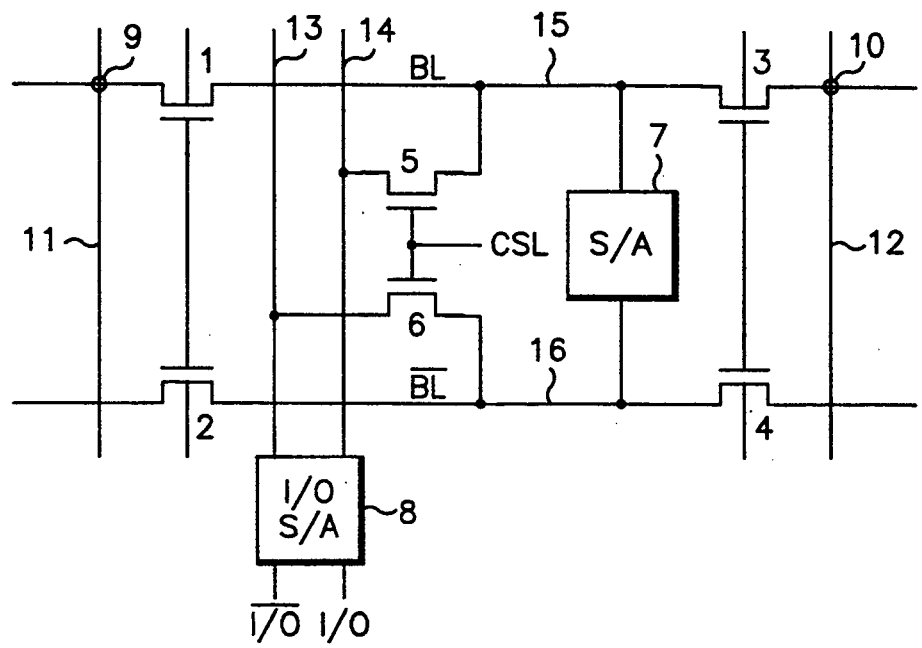
FIG. 1 shows a schematic diagram of a conventional data transmission circuit.
Figure 2:
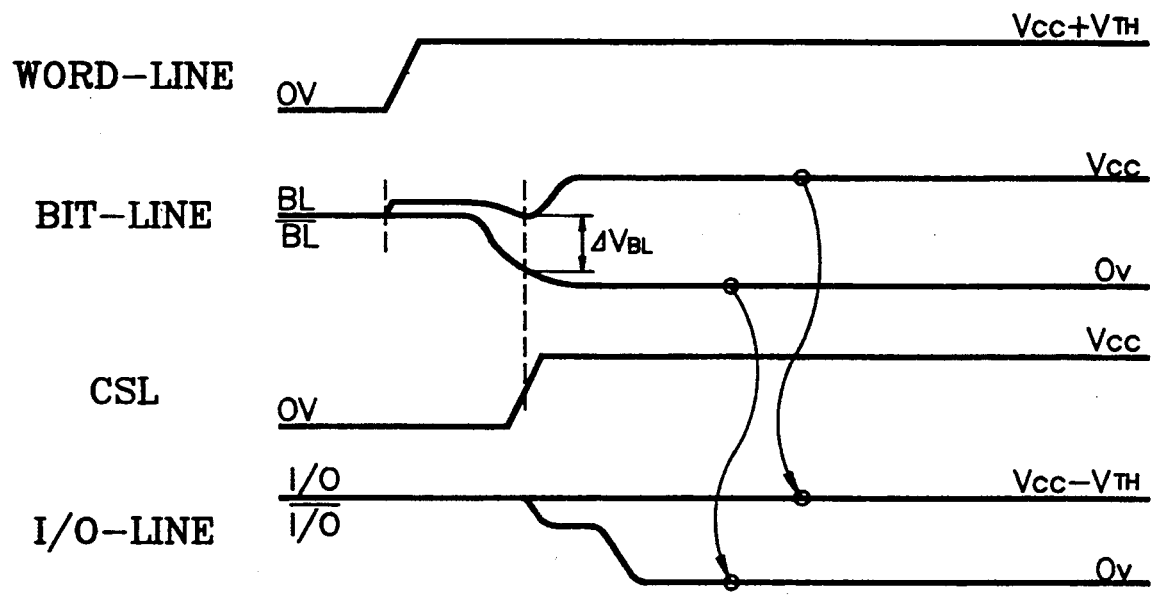
FIG. 2 shows a timing chart during the read operation of FIG. 1.
Figure 3:
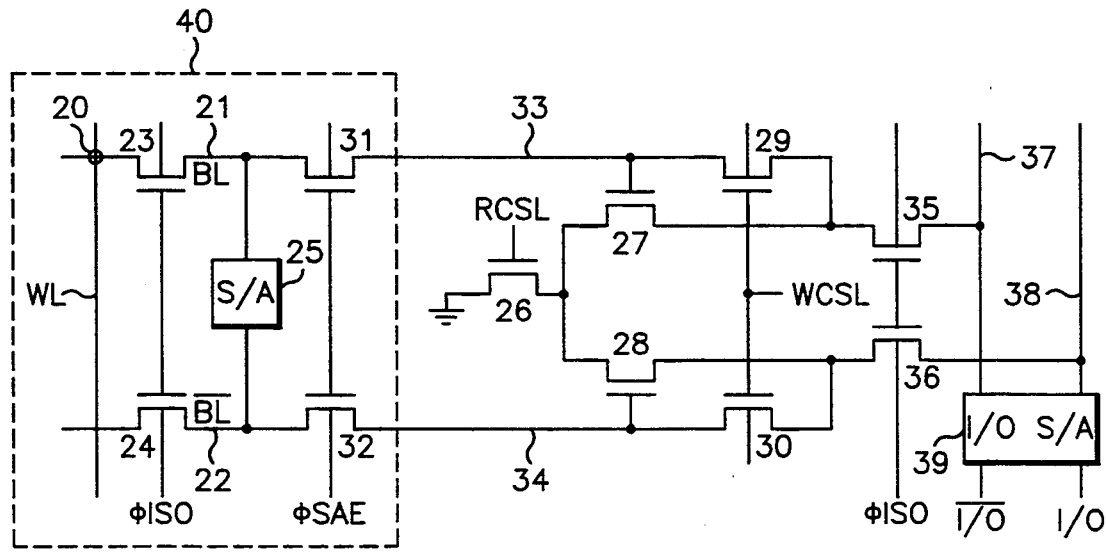
FIG. 3 shows a schematic diagram of another conventional data transmission circuit
Figure 5:
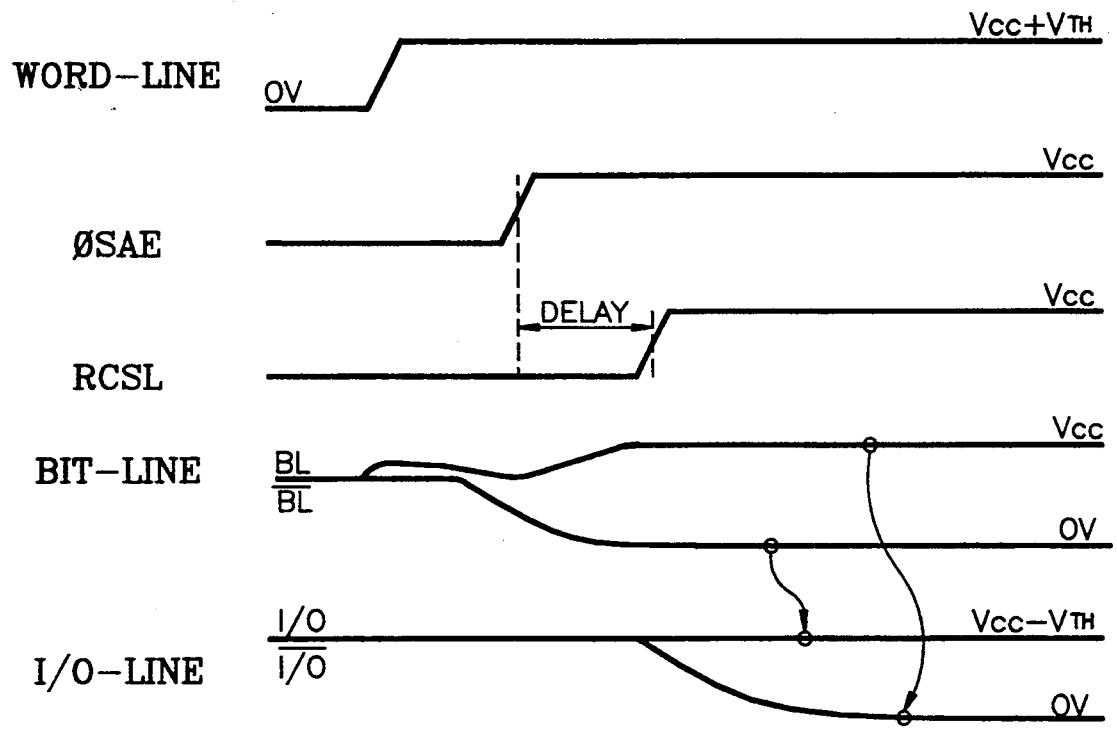
FIG. 5 shows a timing chart during the read operation of FIG. 3.
Figure 4:
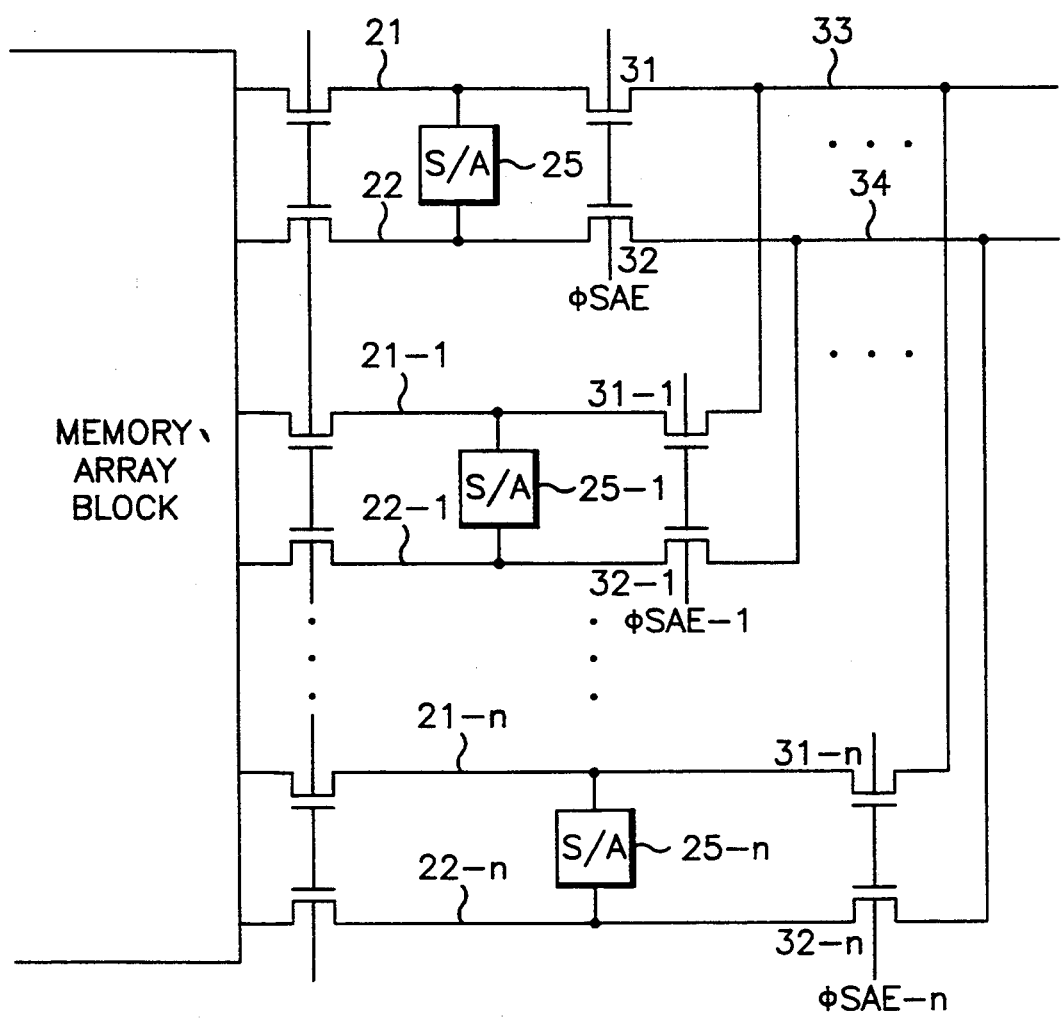
FIG. 4 shows a partial more detailed circuit diagram of FIG. 3.
Figure 7:
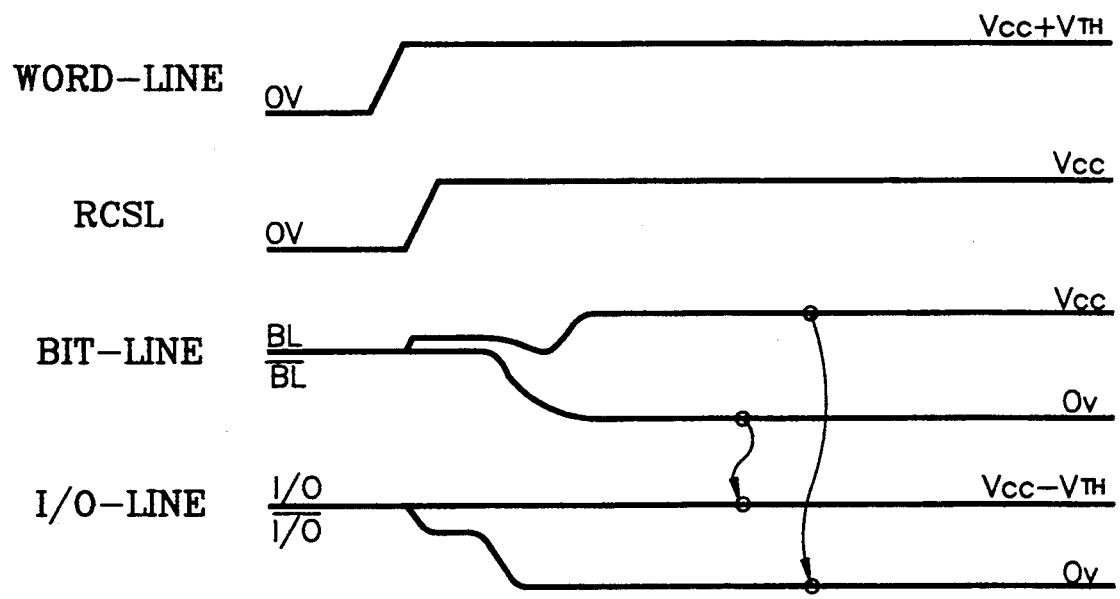
FIG. 7 shows a timing chart during the read operation of FIG. 6.

Next, the operation of the above data transmission circuit is described with reference to FIG. 7. It should be noted that the output transistors 75 and 76 are operated as switching transistors as shown in FIG. 3. When reading data stored in the memory cell 61, a word line 63 is selected, and the data of the memory cell 61 is transferred to the bit line 65. Then the potential difference between the bit lines 65 and 66 is amplified through the sense amplifier 73. Thereafter, if the read column selection line RCSL signal is selected, the discharge transistor 74 is turned on, and the first and second output transistors 75 and 76 are operated as a current sense amplifier. In other words, as shown in FIG. 7, the potential of the first input/output line 71 maintains its level, because the second output transistor 76 is turned off. The potential of the second input/output line 72 comes to a ground voltage level through the discharge transistor 74, because the first output transistor 75 is turned on. Then, the potential difference of the first and second input/output lines 71 and 72 is amplified through the sense amplifier 79, and the output of the sense amplifier 79 is transferred to the exterior of the chip. The above read operation is performed at high speed, more than if the potential of the bit lines are transferred to the input/output line through the channel of the input/output transistor, as shown in FIG. 1. Furthermore, since there is no need that the data should pass through two NMOS transistors 31 and 35 or 32 and 36 as shown in FIG. 3, the voltage drop does not take place.

Next, the data write operation is described. For example, let us assume that complementary data is conveyed on the first and second input/output lines 71 and 72. Then, if the write column selection line WCSL signal is selected, the data of the first and second input/output lines 71 and 72 are transferred to the bit lines 65 and 66 through the first and second input transistors 77 and 78. Thereafter, the data of bit lines 65 and 66 are stored into the memory cell 61 (or 62) as a level-up data, through the sense amplifier 73 for amplifying a voltage between bit lines 65 and 66. In the above write operation, since the data passes through only one input transistor, the write gain is improved, the data of a higher level than that in FIG. 3 is transferred to the bit line, and the transfer time becomes faster compared with the circuit of FIG. 3. Thus, the data input/output is performed at high speed. Also the construction element of the data transmission circuit according to the present invention is simple, as a result of which, the high integration can be easily achieved. In particular, the voltage drop is not generated during the read operation. Also during the write operation, the voltage drop is generated through only one NMOS transistor. Therefore, there is no necessity for constructing the boostrap circuit such as the circuit needed in FIG. 3. Moreover, in the case of the circuit of FIG. 3, a pair of data input/output lines should be provided with the memory array block. However, in the present invention, since two memory array blocks share a pair of data input/output lines, one data transmission circuit is in charge of two memory array blocks.

As described above, the data transmission circuit according to the present invention can simultaneously achieve the high-speed operation of a chip and the high integration in a semiconductor integrated circuit. Furthermore, this makes a great contribution to the compact design of a future semiconductor integrated circuit and to the shortening of data access time.

While the present invention has been particularly shown and described with reference to the preferred embodiment thereof, it will be understood by those skilled in the art that the foregoing and other changes in form and details may be made without departing from the spirit and scope of the present invention.

What is claimed is:

1. A data transmission circuit for use in a semiconductor memory device comprising first and second memory array blocks each having a plurality of memory cells for storing data, a plurality of bit lines each commonly connected to said first and second memory array blocks, a plurality of isolation transistors connected to said bit lines for selecting one of said first and second memory array block, and a bit line sense amplifier for amplifying a potential difference between a first of said bit lines and a second of said bit lines, said circuit comprising:

a plurality of common input/output lines for commonly transferring the data of said first and second memory array blocks;

input means having a first channel connected between a first of said common input/output lines and said first bit line, and a second channel connected between a second of said common input/output lines and said second bit line, said input means being operable by a control signal, for transferring data conveyed on said common input/output lines to said bit lines; and output means having a first control terminal connected to said first bit line to control a third channel, one terminal of said third channel being connected to said first common input/output line, said output means having a second control terminal connected to said second bit line to control a fourth channel, one terminal of said fourth channel being connected to said second common input/output line, a second terminal of said third channel being commonly connected to a second terminal of said fourth channel, and means for providing a voltage in response to a given operating signal to said second terminal of said third channel and said second terminal of said fourth channel, said output means for transferring a state of the potential difference between said first bit line and said second bit line, to said common input/output lines, said state capable of being sensed by said given operating signal.

2. The circuit as claimed in claim 1, wherein said input means is comprised of:

a first input transistor having said first channel connected between said first one of said common input/output lines and said first bit line, and having a first input control terminal coupled to receive said control signal; and a second input transistor having said second channel connected between said second one of said common input/output lines and said second bit line, and having a second input control terminal coupled to receive said control signal.

3. The circuit as claimed in claim 2, wherein said control signal is a write column selection line signal.

4. The circuit as claimed in claim 1, wherein said output means is comprised of:

said means for providing a voltage being comprised of a discharge transistor having a fifth channel, a first terminal of said fifth channel being connected to a ground voltage, and having a fifth control terminal coupled to receive said given operating signal;

a first output transistor having said third channel connected between a second terminal of said fifth channel of said discharge transistor and said first one of said common input/output lines, and having said first control terminal of said output means coupled to said first bit line; and a second output transistor having said fourth channel connected between said second terminal of said fifth channel of said discharge transistor and said second of said common input/output lines, and having said second control terminal coupled to said second bit line.

5. The circuit as claimed in claim 4, wherein said given operating signal is a read column selection line signal.

6. A data transmission circuit for use in a semiconductor memory device having first and second memory array blocks comprised of a plurality of memory cells each storing given data, a plurality of bit lines each connected in common to said first and second memory array blocks, a plurality of isolation transistors connected to said bit lines, for selecting a first or second memory array block, and a bit line sense amplifier for amplifying a potential difference between a first of said bit lines and a second of said bit lines, said circuit comprising:

a plurality of input/output lines for complimentarily transferring said data;

a first input transistor having a channel connected between a first one of said input/output lines and said first bit line, and having a control terminal coupled to receive a given first control signal;

a second input transistor having a channel connected between a second one of said input/output lines and said second bit line, and having a control terminal coupled to receive said first control signal;

a discharge transistor having a channel, a first terminal of said channel being connected to a ground voltage, and having a control terminal coupled to receive a given second control signal;

a first output transistor having a channel connected between a second terminal of said channel of said discharge transistor and said first one of said input/output lines, and having a control terminal coupled to said first bit line; and a second output transistor having a channel connected between said second terminal of said channel of said discharge transistor and said second one of said input/output lines, and having a control terminal coupled to said second bit line.

7. The circuit as claimed in claim 6, wherein an operating time of said given second control signal is different from the operating time of said given first control signal.

8. The circuit as claimed in claim 6, wherein said given first control signal is a write column selection line signal and said given second control signal is a read column selection line signal.

9. The circuit as claimed in claim 6, wherein said discharge transistor generates a complementary switching operation of said first and second output transistors, when said given second control signal is enabled.

10. A data transmission circuit for use in a semiconductor memory device having first and second memory array blocks having a plurality of memory cells for storing data, including a first and second bit line, each bit line connecting the first and second memory array blocks, a plurality of isolation transistors connected to said bit lines for selecting said first and second memory array blocks, and a bit line sense amplifier for amplifying a potential difference between the first and second bit lines, said circuit comprising:

a pair of input/output lines for transferring data between said first and second memory array blocks and for transferring data to the exterior of a chip containing said data transmission circuit;

input means for transmitting the data from said pair of input/output lines to said bit lines, said input means operated by an input control signal and having a pair of input channels, each one of said pair of input channels connecting one of said bit lines to a respective one of said pair of input/output lines; and output means for transmitting the data from said bit lines to said pair of input/output lines, said output means controlled by an output control signal and data signals from said bit lines and having a pair of output channels, each one of said pair of output channels with a first end connected to a respective one of said input/output lines and a second end connected to the second end of the other output channel, said output means having a discharge transistor having a discharge input terminal coupled to receive said output control signal, and a discharge channel having a first terminal connected to a first potential and a second terminal connected to the second end of each one of said pair of output channels by way of a connecting node.

11. The data transmission circuit as claimed in claim 10, wherein said input means comprises:
   a first input transistor having a first one of said pair of input channels connected between a first one of said pair of input/output lines and said first bit line, and a first control terminal for receiving said input control signal; and
   a second input transistor having a second one of said pair of input channels connected between a second one of said pair of input/output lines and said second bit line, and a second control terminal for receiving said input control signal.

12. The data transmission circuit as claimed in claim 10, wherein said output means comprises:
   a first output transistor having a first input control terminal coupled to said first bit line, and a first one of said pair of output channels having a first terminal connected to a first one of said pair of input/output lines and a second terminal connected to said connecting node; and
   a second output transistor having a second input control terminal coupled to said second bit line, and a second one of said pair of output channels having a first terminal connected to a second one of said pair of input/output lines and a second terminal connected to said connecting node.

13. The data transmission circuit as claimed in claim 11, wherein said output means comprises:
   a first output transistor having a first input control terminal coupled to said first bit line, and a first one of said pair of output channels having a first terminal connected to said first one of said pair of input/output lines and a second terminal connected to said connecting node; and
   a second output transistor having a second input control terminal coupled to said second bit line, and a second one of said pair of output channels having a first terminal connected to said second one of said pair of input/output lines and a second terminal connected to said connecting node.

14. The data transmission circuit as claimed in claim 13, further comprising input/output sense amplifying means for amplifying the potential difference between said pair of input/output lines.

15. The data transmission circuit as claimed in claim 10, wherein said input control signal is a write column selection line signal and said output control signal is a read column selection line signal.

16. The data transmission circuit as claimed in claim 13, wherein said input control signal is a write column selection line signal and said output control signal is a read column selection line signal.

17. The data transmission circuit as claimed in claim 12, wherein said first output transistor is in a first state when said second output transistor is in a second state and said first output transistor is in said second state when said second output transistor is in said first state.

18. The data transmission circuit as claimed in claim 12, wherein said discharge transistor alternately causes a potential of each of said pair of input/output lines to be substantially equal to said first potential when said discharge transistor receives said output control signal.

* * * * *

UNITED STATES PATENT AND TRADEMARK OFFICE
CERTIFICATE OF CORRECTION

PATENT NO. : 5,341,331
DATED : August 23, 1994
INVENTOR(S) : Jun-Young Jeon

It is certified that error appears in the above-indentified patent and that said Letters Patent is hereby corrected as shown below:

Column 3

Line 49    Change "$\theta$" to --$\phi$--;

Column 6

Line 17    After "also" insert --,--:

Signed and Sealed this

Twenty-sixth Day of November 1996

Attest:

BRUCE LEHMAN

*Attesting Officer*    *Commissioner of Patents and Trademarks*